United States Patent [19]

Rose

[11] Patent Number: 5,005,282
[45] Date of Patent: Apr. 9, 1991

[54] METHOD OF MAKING AN ELECTRONIC MEMORY CARD

[75] Inventor: Renë Rose, Bretonneux, France

[73] Assignee: Schlumberger Industries, Montrouge, France

[21] Appl. No.: 356,357

[22] Filed: May 24, 1989

[30] Foreign Application Priority Data

May 25, 1988 [FR] France ................................ 88 06921

[51] Int. Cl.⁵ ............................................ H01R 43/00
[52] U.S. Cl. ..................... 29/827; 174/52.4; 264/272.17
[58] Field of Search .......................... 29/827; 174/52.4; 156/552; 361/421; 235/488, 492; 264/251, 272.17

[56] References Cited

U.S. PATENT DOCUMENTS

| | | | |
|---|---|---|---|
| 4,264,917 | 4/1981 | Ugon | 357/74 |
| 4,483,067 | 11/1984 | Parmentier | 29/840 |
| 4,663,833 | 5/1987 | Tanaka et al. | 264/272.17 |
| 4,674,175 | 6/1987 | Stampfli | 29/841 |
| 4,722,137 | 2/1988 | Ellenberger | 174/52.4 |
| 4,746,392 | 5/1988 | Hoppe | 264/272.17 |
| 4,774,633 | 9/1988 | Dehaine et al. | 361/398 |

FOREIGN PATENT DOCUMENTS

| | | | |
|---|---|---|---|
| 26457 | 3/1981 | Japan | 29/827 |
| 84156 | 5/1982 | Japan | 29/827 |

*Primary Examiner*—P. W. Echols
*Attorney, Agent, or Firm*—Lowe, Price, Leblanc, Becker & Shur

[57] ABSTRACT

A method of making an electronic memory card and, more particularly an electronic module. A metal strip (10) has a plurality of lead-frames (A) formed therein. An insulating strip (50) is fixed to the outside face (10a) of the strip (10) leaving the external tabs (20a to 34a) of the electronic module uncovered. In the following steps, a semiconductor chip is fixed on the inside face of the lead-frame and then the lead-frame (A) is separated from the remainder of the strip (10) by being cut off therefrom.

11 Claims, 4 Drawing Sheets

METHOD OF MAKING AN ELECTRONIC MEMORY CARD

The present invention relates to a method of making an electronic memory card, and to an electronic memory card made by implementing the said method.

As is well known, an electronic memory card essentially comprises a card body generally made of a plastic material and having an electronic module fixed therein. Usually the electronic module comprises a printed circuit element. Areas of metallization are provided on the outside face of the printed circuit to define external electrical contact tabs for the card. The inside face of the printed circuit has a semiconductor chip fixed thereon and the terminals of the chip are electrically connected to the contact tabs by various different techniques. The external tabs are used for establishing an electrical connection between the circuit on the card and a card reader.

However, a printed circuit is relatively expensive, firstly because it includes an insulating support whose cost is not negligible, and secondly and above all because the various metallized areas on the insulating support are defined geometrically by chemically etching a layer of metallization originally deposited uniformly on the insulating support. Chemical etching is an expensive technique.

In order to reduce the price of the electronic module, a proposal has already been made in European patent application number 254,640 to replace the printed circuit by a lead-frame. In other words, the electronic module is constituted by a set of substantially plane electrical conductors on which the semiconductor chip is fixed directly. The various electrical conductors are obtained by cutting out or by stamping a continuous metal strip, thereby avoiding a chemical etching operation.

The object of the present invention is to provide a novel method of making a card, and more particularly of making its electronic module, which method also makes use of a lead-frame, and which facilitates installation of the electronic module in the card body.

In order to achieve this object, the method of making an electronic memory card comprising an electronic module mounted on a card body is characterized in that it comprises the following steps:

(a) a lead-frame is provided defining various conductor elements at least some of which form external electrical contact tabs for the card;

(b) electrically insulating reinforcement material is fixed on said frame in such a manner that said material covers neither said external tabs disposed on an outside face of said frame nor connection zones disposed on an inside face of said lead-frame;

(c) a semiconductor chip is fixed on said inside face of the lead-frame and the terminals of said chip are electrically connected to said connection zones, thereby obtaining said electronic module; and (d) the electronic module is fixed on the body of said card.

The invention also relates to a method of making a plurality of electronic memory cards each comprising an electronic module mounted on a card body and characterized in that it comprises the following steps:

(e) a strip of conducting material is provided and a plurality of lead-frames is formed therein, each lead-frame comprising a plurality of conductor elements separated from one another but mechanically connected to the remainder of said strip, at least one portion of each conductor element constituting an external electrical contact tab;

(f) insulating reinforcement material is fixed on said conducting strip in such a manner that said reinforcement material covers a portion of each conductor element in each lead-frame, but covers neither said external contact tabs of said lead-frames disposed on an outside face of said conducting strip, nor the connection zones of each conductor element disposed on the inside face of said strip;

(g) a semiconductor chip is fixed on the inside face of each lead-frame and the terminals of said chip are fixed to the connection zones of said frame;

(h) each lead-frame is separated from the remainder of the strip, thereby obtaining said electronic modules; and (i) each electronic module obtained in this way is fixed on a card body.

It will be understood that the mechanical strength of the lead-frame is considerably increased by the addition of insulating material, thereby making it easy to separate from the remainder of the conducting strip. However, this technique does not involve the extra cost inherent in using a conventional circuit.

Other characteristics and advantages of the invention appear more clearly on reading the following description of various implementations of the invention given by way of nonlimiting example. The description refers to the accompanying drawings, in which.

A first embodiment of a memory card in accordance with the invention is initially described with reference to FIGS. 1 to 5.

Figure 1:
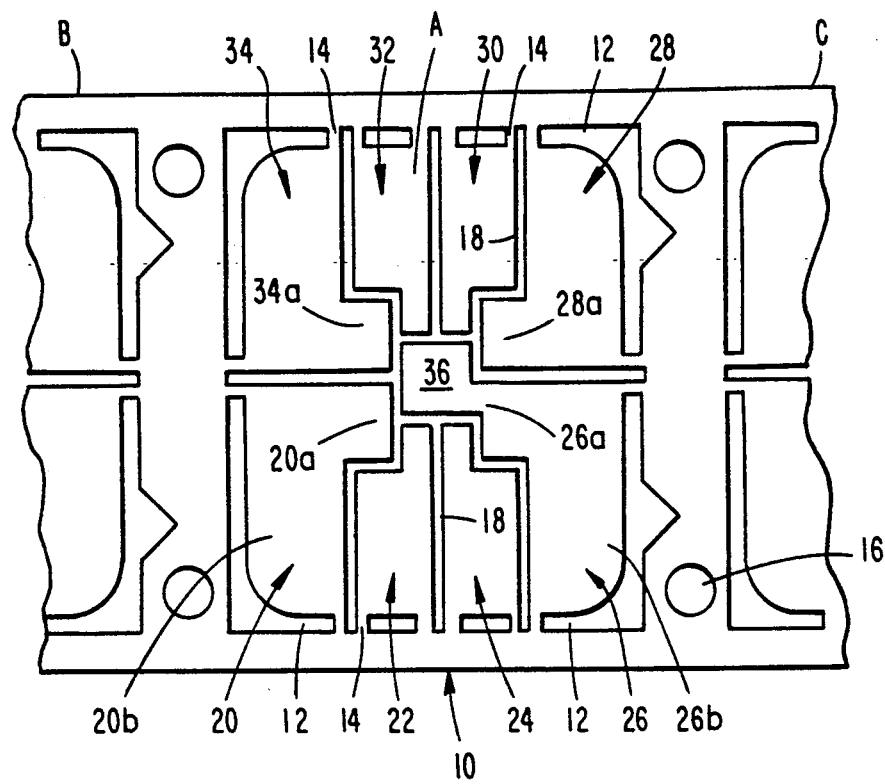
FIG. 1 is a plan view of a metal strip machined to form a plurality of lead-frames.

FIG. 1 is a plan view showing a portion of a conducting metal strip 10 which has been machined to define a succession of identical patterns. FIG. 1 shows a pattern A, and portions of patterns B and C. The strip 10 may be 0.1 mm thick and 16 mm wide, for example. It is made of copper having both faces covered with respective deposits of nickel to a depth of 3 micrometers. More generally, the thickness of the conducting strip lies in the range 0.075 mm to 0.25 mm. Each pattern (referred to below as a lead-frame) is separated from the remainder of the strip 10 by a slot 12. The overall shape of the lead-frame separated in this way from the remainder of the strip 10 is generally rectangular and occupies 12.8 mm by 11.6 mm. As shown in FIG. 1, the slot 12 is not continuous. It is interrupted by "bridges" 14 which mechanically connect the lead-frame A to the remainder of the strip. In addition the strip 10 includes reference holes 16.

The lead-frame A is split up into a plurality of conducting zones by slots 18. FIG. 1 shows conducting zones 20 to 34. Each of the conducting zones 20 to 34 comprises a connection zone 20a to 34a close to the middle of the lead-frame, and a contact zone 20b to 34b which is close to the periphery of the lead-frame. The connection zones 20a to 34a are smaller in area than the contact zones 20b to 34b.

FIG. 1 shows that the connection zone 26a is extended by a central zone 36. The slots 18 which separate the conducting zones are connected to one another in a region which defines the central zone 36. The other end of each slot 18 is engaged with one of the bridges 14 connecting the lead-frame A to the remainder of the strip 10. Advantageously, the various machining operations described above are performed and, the slots 12 and 18, and the holes 16 are formed by stamping which is a cheap operation.

Figure 2:
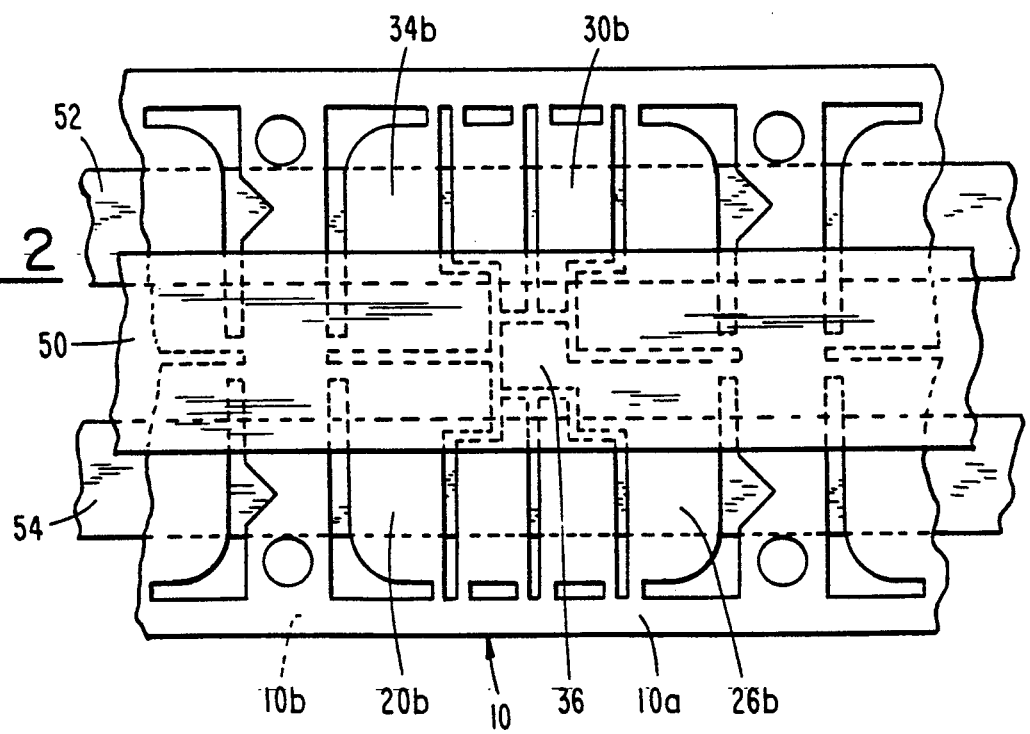
FIG. 2 shows the metal strip of FIG. 1 provided with reinforcement made of insulating material.
Figure 3:
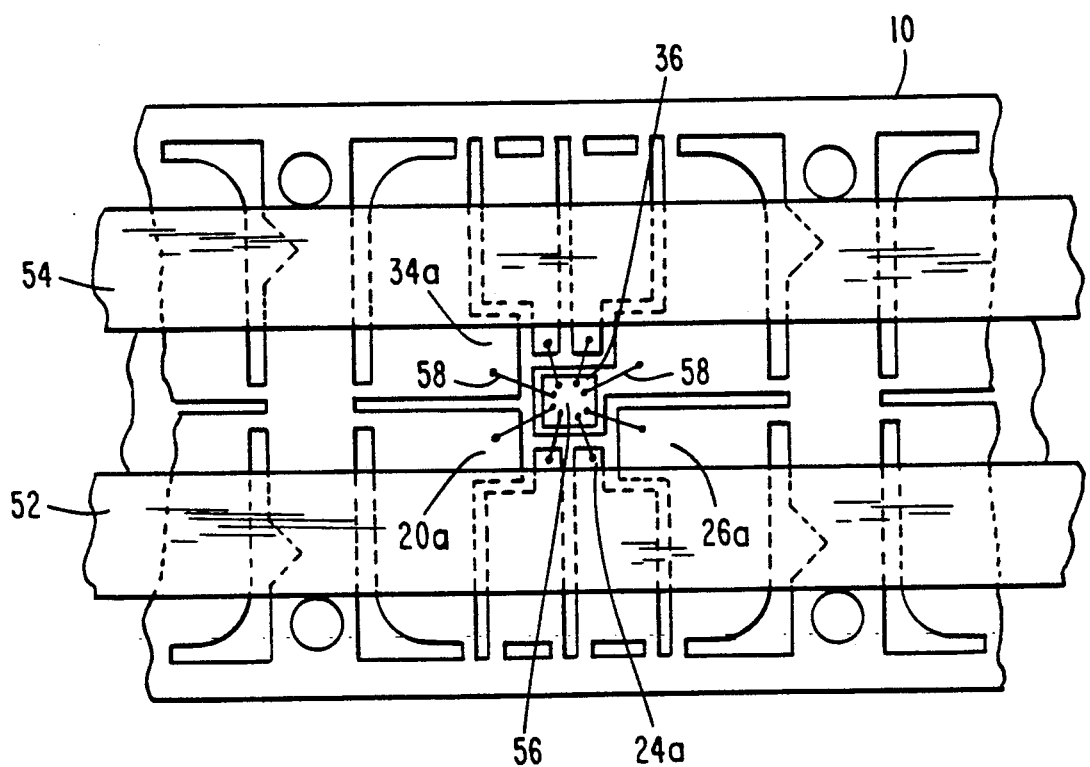
FIG. 3 is an underneath view of the FIG. 2 metal strip after a semiconductor chip has been fixed thereon.

In the following step, as shown in FIG. 2, a strip 50 of insulating material is fixed on the top or outside face 10a of the metal strip 10. The strip 50 is considerably narrower than the metal strip 10 so that it covers the central zone 36 and the connection zones 20a to 34a, but it leaves the contact zones 20b to 34b uncovered. Insulating strip 50 may be 4.8 mm wide and 0.07 mm thick. It may be constituted, for example, by the material sold under the trademark Kapton. One face of the strip 50 is coated with an adhesive. It may be constituted by the material sold by Dupont de Nemours under the trademark PYRALUX. Two insulating strips 52 and 54 of the same nature as the strip 50 are disposed in the same direction as the strip 50 and fixed on the bottom or inside face 10b of the metal strip 10. As shown in FIG. 2, the strips 52 and 54 leave the connection zones 20a to 34a uncovered while covering the major portion of the contact zones 20b to 34b. In addition, a certain amount of overlap is provided between the strip 50 and the strips 52 and 54. This provides a metal strip which is reinforced by insulating strips 50, 52, and 54.

In each lead-frame, the contact zones 20b to 34b of the top face 10a are uncovered and so are the connection zones 20a to 34a of the bottom face 10b.

In variant embodiments, the metal strip 10 is provided with only one insulating strip 50, or with only two insulating strips 52 and 54.

It is preferable, in the following step, to deposit gold on both faces 10a and 10b of the strip 10 in those regions thereof which are not covered by the strips 50 to 54. It will be understood that this achieves a considerable saving compared with the prior art in which gold is deposited over the entire strip 10.

The next step consists in fixing a semiconductor chip 56 on the bottom face 10b of each lead-frame. The chip 56 is fixed to the central zone 36 of the lead-frame. Depending on the particular semiconductor chip used, it is fixed to the lead-frame by means of an adhesive material which is either insulating or else conductive. Thereafter, conductor wires 58 are interconnected between each terminal of the chip 56 and a corresponding one of the connection zones 20a to 34a on the bottom face 10b of the lead-frame. This operation is possible because the connection zones are not covered by the strips 52 and 54, and because they are preferably gold-plated.

Figure 5:
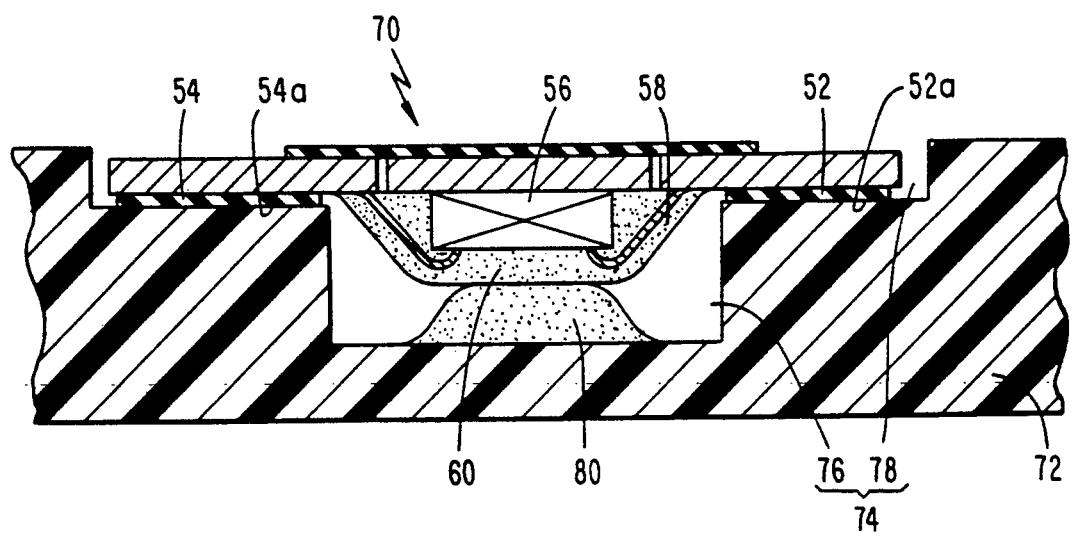
FIG. 5 is a vertical section view showing a first way of fixing the electronic module to a card body.

In the next step, a drop of adhesive insulating material 60 is deposited on the bottom face 10b of the lead-frame so that the material covers the chip 56 and its conductor wires 58, as can be seen in FIG. 5. This provides a complete electronic module constituted by lead-frame A and a semiconductor chip 56, with the electronic module still being mechanically connected to the remainder of the strip 10 via the metal bridges 14 and the insulating strips 50, 52, and 54. This strip is therefore easy to handle.

In the next step, the electronic modules of the strip 10 are separated by using an appropriate tool for cutting the bridges 14 and the strips 50, 52, and 54 close to the slots 12.

Figure 4:
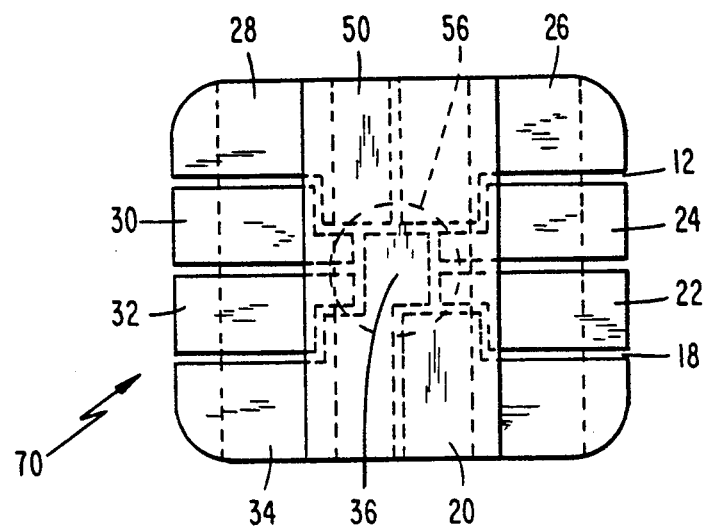
FIG. 4 is a plan view of a complete electronic module after being separated from the remainder of the metal strip.

This provides electronic modules 70 as shown in FIG. 4. Each module comprises a lead-frame constituted by eight conducting zones 20 to 34 which are electrically separated from one another by the slots 18. The top face of the electronic module 70 has the cut-off portion of insulating strip 50, together with gold-plated contact zones 20b to 34b on either side thereof. The middle of the bottom face of the electronic module has the insulating material 60 in which the semiconductor chip 56 is embedded, and on either side thereof there are portions of the insulating strips 52 and 54.

In the final step, the electronic module 70 is fixed to the card body. FIG. 5 shows a portion of a card body 72 provided with a cavity 74 in which the electronic module 70 is received. The cavity 74 is stepped. It comprises a lower housing 76 for receiving the potted chip 60 and an upper housing 78 for receiving the lead-frame. With the method of fixing shown in FIG. 5, the insulating strips 52 and 54 have their faces 52a and 54a which are not fixed to the lead-frame covered in a bistable adhesive material. By localized application of heat, the adhesive material is activated in order to adhere to the bottom of the upper housing 78. This ensures that the electronic module 70 is very securely fixed to the card body 72.

The fixing of the electronic module on the card body can be further improved by placing a drop 80 of adhesive material in the bottom of the housing 76 prior to installing the electronic module. When the electronic module is put into place, the drop 80 comes into contact with the potting material 60 on the semiconductor chip. After the drop 80 has polymerized, the electronic module 70 is fixed to the card body 72 not only by the adhesive strips 52 and 54, but also by the drop 80.

Naturally, other techniques may be used for fixing the electronic module to the card body. For example, the techniques described in above-mentioned European patent application number 254,640 may be used.

It follows from the above description that the method of making an electronic module in accordance with the present invention has numerous advantages over prior art techniques. It avoids using a printed circuit, which is expensive. By virtue of the lead-frame being reinforced by the, or each, insulating strip, it is easy to cut the electronic module from the metal strip in spite of the small size of the conducting zones of the lead-frame. While gold is being deposited on the metal strip the insulating strips act as masks for limiting the areas on which gold is deposited to those portions of the two faces of the metal strip which are required to have good electrical contact, i.e. the zones in which the conducting wires 58 are fixed and the external contact zones. In addition, since the insulating strip 50 overlaps the insulating strips 52 and 54 to a small extent, there is no danger of the material 60 used for potting the semiconductor chip leaking through to the top face of the lead-frame via the slots 18.

Figure 6:
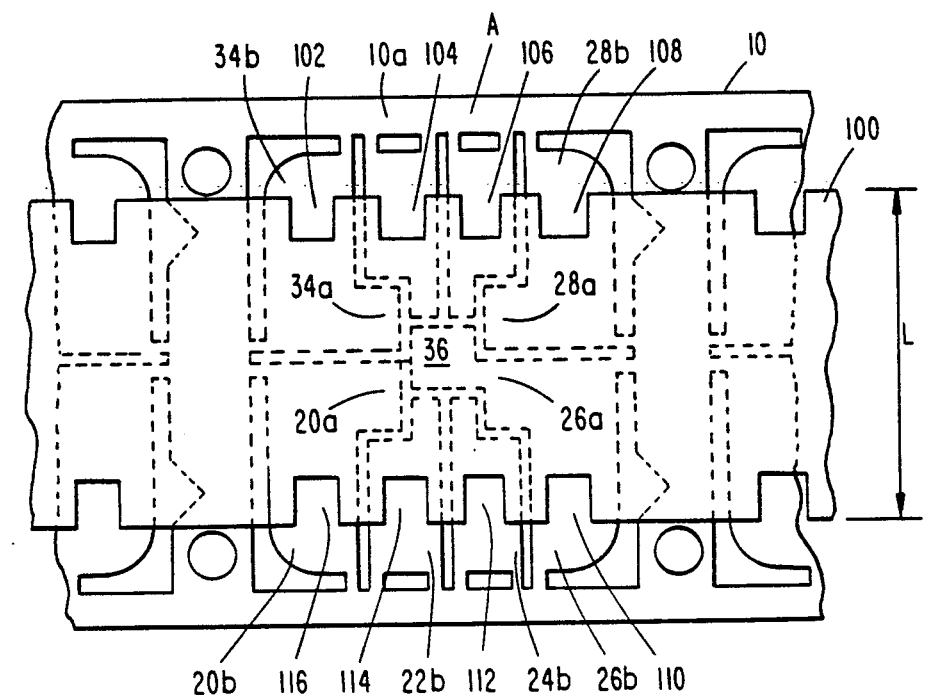
FIG. 6 shows a variant installation of the reinforcing isolating element on the metal strip.

FIG. 6 shows a variant of the method for manufacturing the electronic module. It is based on a metal strip 10 which is identical to that of FIG. 1. It is therefore not described a second time, and the references used in FIG. 1 are reused in FIG. 6. An insulating strip 100 is fixed on the top face 10a of the metal strip. The strip 100 has a width L which is greater than the width of the strip 50. In other words, the strip 100 not only covers the connection zones 20a to 34a, but also covers the major portion of the contact zones 20b to 34b. The strip 100 is made of an insulating material which is photo polymerizable by masking and exposing the strip 100 to appropriate radiation. For example it may be made of the substance sold under the trademark VACREL by the company Dupont de Nemours. When the insulating strip 100 is fixed on the metal strip 10, notches 102 to 116 are defined corresponding to the contact zones 20b to 34b. The sizes of the notches 102 to 116 correspond to the standards laid down by ISO and AFNOR. The advantage of this solution lies in the fact that the strip 100 is wider and therefore provides greater mechanical reinforcement.

In addition, when gold is being deposited on the uncovered surface, its area is substantially equal to the working area required for electrical contact. This means that the quantity of gold required can be further reduced. Naturally it would also be possible to fix a single insulating strip on the lower face 10b of the metal strip 10 and then to provide openings through the single insulating strip by masking and exposure, corresponding to the central zone 36 and to the connection zones 20a to 34a.

The above description always assumes that a plurality of electronic modules are to be made simultaneously using the strip technique. However, it would naturally be possible, within the context of the invention, to base the method on a single lead-frame having one or more portions of insulating tape fixed on one or both of its faces, for some special reason.

Figure 7:
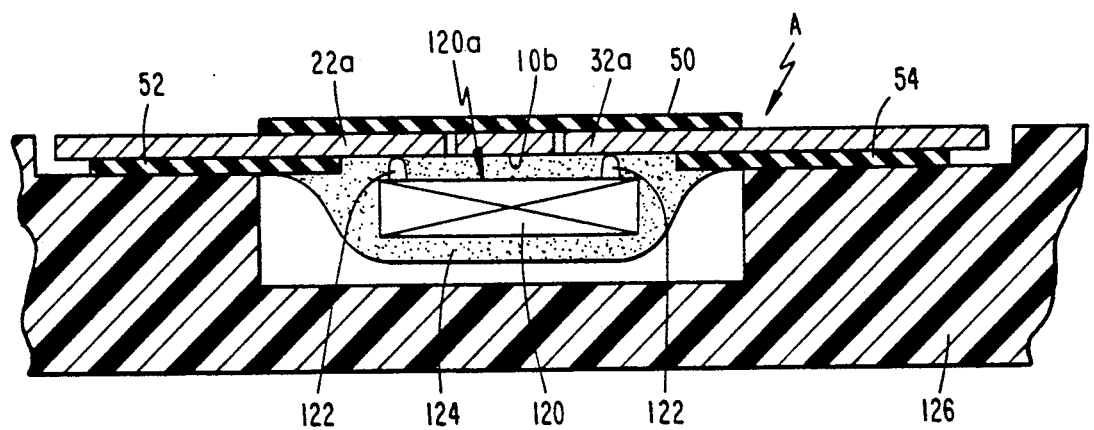
FIG. 7 shows a variant way of fixing the semiconductor chip on the lead-frame.

FIG. 7 shows a variant electronic module, and more particularly a variant of the way in which the semiconductor chip is fixed to the lead-frame. In this variant, a lead-frame, preferably in strip form, is used using the method described with reference to FIGS. 1 and 2 or the method described with reference to FIG. 6. FIG. 7 corresponds to the method described in FIGS. 1 and 2.

The lead-frame A is provided with insulating strip portions 50, 52, and 54. The strips 52 and 54 leave the connection zones 20a to 34a uncovered (only zones 22a and 32a appear in FIG. 7 on the bottom face 10b of the lead-frame). The semiconductor chip 120 is specially prepared. The output terminals of the chip 120 are raised by metal studs such as 122 which stand proud from the face 120a of the chip 120. The studs 122 are directly bonded to the connection zones 20a to 34a. This method of connecting a semiconductor circuit to conducting tracks is generally referred to by the term "bumping". The technique has the advantage of avoiding using conductor wires which could constitute a weak point in an electronic module.

The chip 120 is then embedded in insulating material 124. The electronic module obtained in this way is separated from the remainder of the metal strip and is fixed to the card body 126 by the techniques described above.

What is claimed is:

1. A method of making an electronic memory card comprising an electronic module mounted on a card body, the method comprising the steps of:
    (a) providing a lead-frame having an inside and outside face defining various conductor elements at least some of which form external electrical contact tabs for the card;
    (b) affixing at least one strip of electrically insulating reinforcement material on at least one of said two faces of said lead-frame in such a manner that said strip covers neither external tabs disposed on said outside face of said lead-frame nor connection zones disposed on said inside face of said lead-frame;
    (c) affixing a semiconductor chip on said inside face of the lead-frame and electrically connecting the terminals of said chip to said connection zones, thereby obtaining said electronic module; and
    (d) affixing the electronic module on the body of said card.

2. A method according to claim 1, wherein said insulating material strip is approximately 0.07 mm thick.

3. A method of making a plurality of electronic memory cards each comprising an electronic module mounted on a card body, the method comprising the steps of:
    (a) providing a strip of conducting material having inside and outside faces with a plurality of lead-frames formed therein, each lead-frame comprising a plurality of conductor elements separated from one another but mechanically connected to the remainder of said strip, at least one portion of each conductor element constituting an external electrical contact tab;
    (b) affixing at least one insulating material strip on said conducting strip in such a manner that said insulating strip covers neither said external contact tabs of said lead-frames disposed on an outside face of said conducting strip, nor connection zones of each conductor element disposed on said inside face of said strip;
    (c) affixing a semiconductor chip on the inside face of each lead-frame and affixing the terminals of said chip to the connection zones of said lead-frame;
    (d) separating each lead-frame from the remainder of the conductor strip, thereby obtaining said electronic modules; and
    (e) affixing each of said electronic modules on a card body.

4. A method according to claim 3, further comprising the steps of depositing gold on the inside and outside faces thereof in those portions which are not covered by said insulating material after said insulating material has been affixed to said lead-frames.

5. A method according to claim 3, characterized in that one of the faces of said insulating material includes an adhesive material for affixing said insulating material to said conductive strip.

6. A method according to claim 3, wherein said insulating material strip is approximately 0.07 mm thick.

7. A method of making a plurality of electronic memory cards each comprising an electronic module mounted on a card body, the method comprising the steps of:
    (a) providing a conducting strip of conducting material having inside and outside faces and wherein a plurality of lead-frames is formed, each lead-frame comprising a plurality of conductor elements separated from one another but mechanically connected to the remainder of said conducting strip, at least one portion of each conductor element constituting an external electrical contact tab; and at least a portion of each conductor element forming an inside connection zone;

(b) affixing a first insulating strip of insulating material on the outside face of the conducting strip while leaving uncovered on either side of said insulating strip said external electrical contact tabs, and affixing second and third insulating strips of insulating material on said inside face so as to leave said connection zones uncovered by said insulating material;

(c) affixing a semiconductor chip on the inside face of each lead-frame and connecting the terminals of said chip to said connection zones of said lead-frame;

(d) separating each lead-frame from the remainder of said conductive strip, thereby obtaining said electronic modules; and (e) affixing each of said electronic modules on a card body.

8. A method according to claim 7, characterized in that the first insulating strip overlaps each of said second and third insulating strips.

9. A method according to claim 7, characterized in that said second and third insulating strips have adhesive on both faces, and in that said strips are affixed via one of their faces to said lead-frame and in that said electronic module is affixed to said card body by the opposite adhesive faces of said second and third insulating strips.

10. A method according to claim 7, further comprising the step of depositing gold on the inside and outside faces thereof in those portions which are not covered by said insulating material after said insulating material has been fixed on said lead-frames.

11. A method according to claim 7, characterized in that one of the faces of said insulating material includes an adhesive material for affixing said insulating material.

* * * * *